(12) United States Patent
Oyamada

(10) Patent No.: US 7,040,383 B2
(45) Date of Patent: May 9, 2006

(54) TELECOMMUNICATION DEVICE INCLUDING A HOUSING HAVING IMPROVED HEAT CONDUCTIVITY

(75) Inventor: Takashi Oyamada, Minato-ku (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/218,585

(22) Filed: Aug. 15, 2002

(65) Prior Publication Data

US 2003/0034148 A1   Feb. 20, 2003

(30) Foreign Application Priority Data

Aug. 16, 2001   (JP)   ............................. 2001-246940

(51) Int. Cl.
  *F28D 15/00* (2006.01)
  *B27N 5/02* (2006.01)
(52) U.S. Cl. .............. 165/104.33; 165/46; 165/104.21; 165/80.4
(58) Field of Classification Search ............... 165/80.3, 165/46, 104.21, 104.32, 104.27, 104.33, 165/104.34; 361/699, 700, 703, 704, 705, 361/698; 257/714, 715
See application file for complete search history.

(56) References Cited

U.S. PATENT DOCUMENTS

| | | | | |
|---|---|---|---|---|
| 3,851,221 A | * | 11/1974 | Beaulieu et al. | 361/684 |
| 4,009,417 A | * | 2/1977 | Waldon et al. | 361/38 |
| 4,730,665 A | * | 3/1988 | Cutchaw | 165/80.4 |
| 5,198,889 A | * | 3/1993 | Hisano et al. | 257/678 |
| 5,373,417 A | * | 12/1994 | Barrett | 361/699 |
| 5,390,077 A | * | 2/1995 | Paterson | 361/700 |
| 5,661,637 A | * | 8/1997 | Villaume | 361/687 |
| 5,675,473 A | * | 10/1997 | McDunn et al. | 361/699 |
| 5,704,416 A | * | 1/1998 | Larson et al. | 165/104.33 |
| 5,720,338 A | * | 2/1998 | Larson et al. | 165/46 |
| 5,944,093 A | * | 8/1999 | Viswanath | 165/104.26 |
| 6,158,502 A | * | 12/2000 | Thomas | 165/104.26 |
| 6,367,543 B1 | * | 4/2002 | Calaman et al. | 165/80.4 |
| 6,472,031 B1 | * | 10/2002 | Daecher et al. | 428/1.1 |
| 6,525,420 B1 | * | 2/2003 | Zuo et al. | 257/715 |
| 2002/0021556 A1 | * | 2/2002 | Dibene et al. | 361/704 |
| 2002/0056908 A1 | * | 5/2002 | Brownell et al. | 257/714 |
| 2002/0118511 A1 | * | 8/2002 | Dujari et al. | 361/703 |

FOREIGN PATENT DOCUMENTS

| | | |
|---|---|---|
| DE | 195 45 448 A1 | 6/1997 |
| EP | 0 946 085 A1 | 9/1999 |
| EP | 1 130 951 A2 | 9/2001 |
| JP | S59-127898 A | 7/1984 |
| JP | S61-136549 U | 8/1986 |
| JP | H01-264296 A | 10/1989 |
| JP | H02-018995 A | 1/1990 |
| JP | H02-036078 U | 3/1990 |
| JP | H02-067792 A | 3/1990 |
| JP | H04-245499 A | 9/1992 |
| JP | H05-243771 A | 9/1993 |
| JP | H07-067231 A | 3/1995 |

(Continued)

*Primary Examiner*—Tho Duong
(74) *Attorney, Agent, or Firm*—Sughrue Mion, PLLC

(57) ABSTRACT

A telecommunication device includes a housing formed by gas-assist injection molding and having an inner wall, outer wall and a hollow space formed therebetween and receiving therein gas refrigerant. The hollow space has a plurality of vertical channels wherein the gas refrigerant cools the internal of the housing by natural convection within the vertical channels. A movable wall is disposed in the vertical channel for controlling a pressure rise occurring upon a temperature rise.

18 Claims, 4 Drawing Sheets

| | FOREIGN PATENT DOCUMENTS | | | JP | H11-163237 A | 6/1999 |
|---|---|---|---|---|---|---|
| | | | | JP | H11-204952 A | 7/1999 |
| JP | 7-94881 A | 4/1995 | | JP | 2000-198388 A | 7/2000 |
| JP | H07-029499 U | 6/1995 | | JP | 2000-208948 A | 7/2000 |
| JP | H08-025400 A | 1/1996 | | JP | 2000-340978 A | 12/2000 |
| JP | H09-017920 A | 1/1997 | | | | |
| JP | H09-207207 A | 8/1997 | | * cited by examiner | | |
| JP | H11-054973 A | 2/1999 | | | | |

TELECOMMUNICATION DEVICE INCLUDING A HOUSING HAVING IMPROVED HEAT CONDUCTIVITY

BACKGROUND OF THE INVENTION (a) Field of the Invention

The present invention relates to a telecommunication device including a housing having improved heat conductivity and, more particularly, to a heat radiation structure of the housing of a telecommunication device.

(b) Description of the Related Art

A gas-assist injection molding (GAIM) technique is widely used for molding a variety of plastic materials because the GAIM technique provides an improved appearance without an undesired projection or warp on the surface, and an improved strength and a light weight due to the structure of the hollow space.

For example, the interior accessories of a vehicle or television cabinets are manufactured by using the GAIM technique due to the improvement of the quality in the injection-molded parts, as well as the needs for smaller weight and dimensional accuracy in the interior accessories and the television cabinets.

Among other devices, a telecommunication device such as a base station of a personal handyphone system, which is generally attached onto a mast, is requested to radiate the internal heat generated by the integrated circuit therein, and have a housing with a smaller weight and smaller dimensions for achieving a lower cost.

The GAIM technique is not used heretofore in manufacture of the housing through which efficient heat radiation is requested, because the plastic material formed by the GAIM technique has lower heat conductivity compared to a metallic material.

Aluminum is generally used heretofore as the material for a housing of the base station of a personal handyphone system due to the excellent heat conductivity thereof. However, since the aluminum housing is generally formed as a solid body, the heat radiation capability of the aluminum housing is limited by and does not exceed the heat conductivity property of the aluminum metal.

Incorporation of metallic powder such as aluminum or copper into the plastic material may improve the heat conductivity of the plastic housing; however, the improved heat conductivity is yet far inferior to the heat conductivity of the solid metal itself.

Patent Publication JP-A-7-094881 describes a heat radiation structure of an electric equipment such as a computer. The heat radiation structure includes a cooling device for cooling therein refrigerant, a plurality of cooling modules through which the refrigerant passes, a tube system including supply paths and return paths between the cooling device and the cooling modules for circulating the refrigerant, and a plurality of pivot valves each disposed for a return path of a corresponding cooling module and having an extendable rod for controlling the flow rate of the refrigerant passing through the pivot valve based on the temperature of the refrigerant.

The heat radiation structure described in the above publication, however, has a complicated structure due to provision of the pivot valves for controlling the flow rate of the refrigerant through the cooling modules.

Patent Publication JP-A-2000-340978 describes a heat radiation structure of a telecommunication device, wherein a heat radiator having a plurality of heat radiation fins are attached onto the inner surface of the housing of the telecommunication device. Each of the heat radiation fins includes therein a heat pipe extending in the vertical direction for assisting the flow of the heat in the heat radiation fin, thereby improving the heat conductivity of the heat radiation structure without increasing the dimensions of the heat radiation fin.

Fabrication of the heat radiation structure of the telecommunication device described in the latter publication, however, is also complicated due to the provision of the heat pipes within the heat radiation fins.

SUMMARY OF THE INVENTION

In view of the above, it is an object of the present invention to provide a telecommunication device including a housing having improved beat radiation capability substantially without complicating the fabrication process or the, structure of the housing.

More particularly, it is an object of the present invention to provide a telecommunication device having an improved housing, which is suited for fabrication by using the GAIM technique and is capable of improving the heat radiation property.

The present invention provides, in a first aspect thereof, a telecommunication device including a housing having an inner wall, an outer wall, and a hollow space formed between the inner wall and the outer wall and receiving therein refrigerant, and an internal circuit having a portion coupled to the inner wall via a heat conductive member.

In accordance with the telecommunication device of the first aspect of the present invention, the heat generated by the internal circuit is transferred to the inner wall via the heat conductive member, and then to the refrigerant in the hollow space, and is radiated outside the housing via the refrigerant due to the natural convection of the refrigerant within the hollow space, whereby an efficient heat radiation is achieved.

The present invention also provides, in a second aspect thereof, a telecommunication device including a housing having an inner wall, an outer wall, and a hollow space formed between the inner wall and the outer wall and receiving therein refrigerant, and an internal circuit received in the housing, wherein the housing is formed by gas-assist injection molding (GAIM) technique.

In accordance with the telecommunication device of the second aspect of the present invention, the GAIM technique provides a housing having a hollow space for receiving the refrigerant, sufficient strength, light weight and excellent radiation structure, and fabricated at a lower cost.

The above and other objects, features and advantages of the present invention will be more apparent from the following description, referring to the accompanying drawings.

PREFERRED EMBODIMENT OF THE INVENTION

Figure 1:
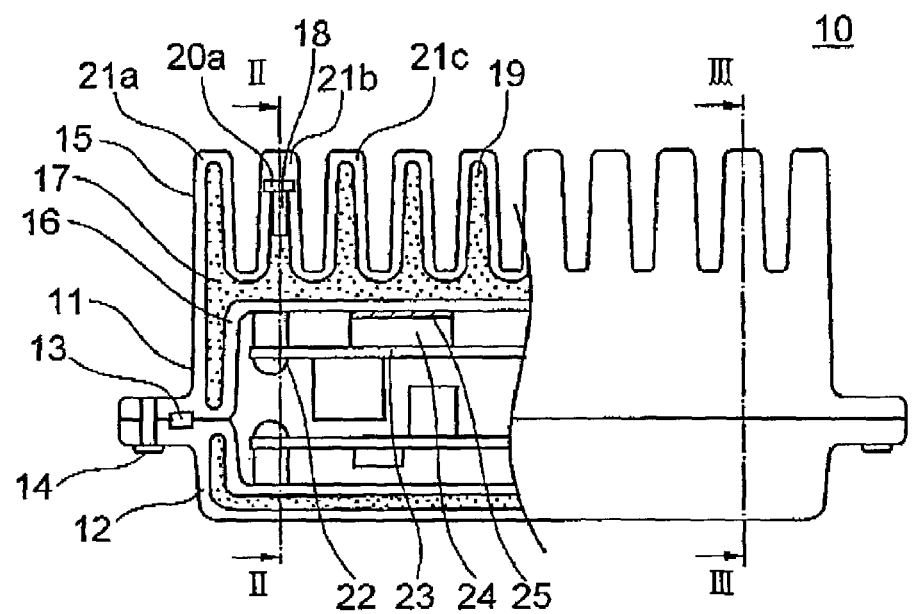
FIG. 1 is a partially broken elevation of a telecommunication device according to an embodiment of the present invention.

Now, the present invention is more specifically described with reference to accompanying drawings. Referring to FIG. 1, a telecommunication device, such as a base station of a personal handyphone system, according to an embodiment of the present invention includes a housing 10 formed by a GAIM technique using a plastic material. The housing 10 includes a housing body 11 and a cover 12, which are fixed together using screws 14 and nuts with an intervention of a seal member 13, such as a gasket. The housing 10 receives therein a plurality of units 23 each mounting thereon a plurality of integrated circuits 24.

Each of the housing body 11 and the cover 12 has an outer wall 15 and an inner wall 16, between which a hollow space 17 is formed. The hollow space 17 of the housing body 11 includes a plurality of channels formed in the outer wall 15 and extending parallel to one another, thus forming a plurality of wave shapes in cross-section. The channels are formed in the fabrication process of the housing body 11 by using a GAIM technique, increasing the, mechanical strength of the housing 10.

Figure 2:
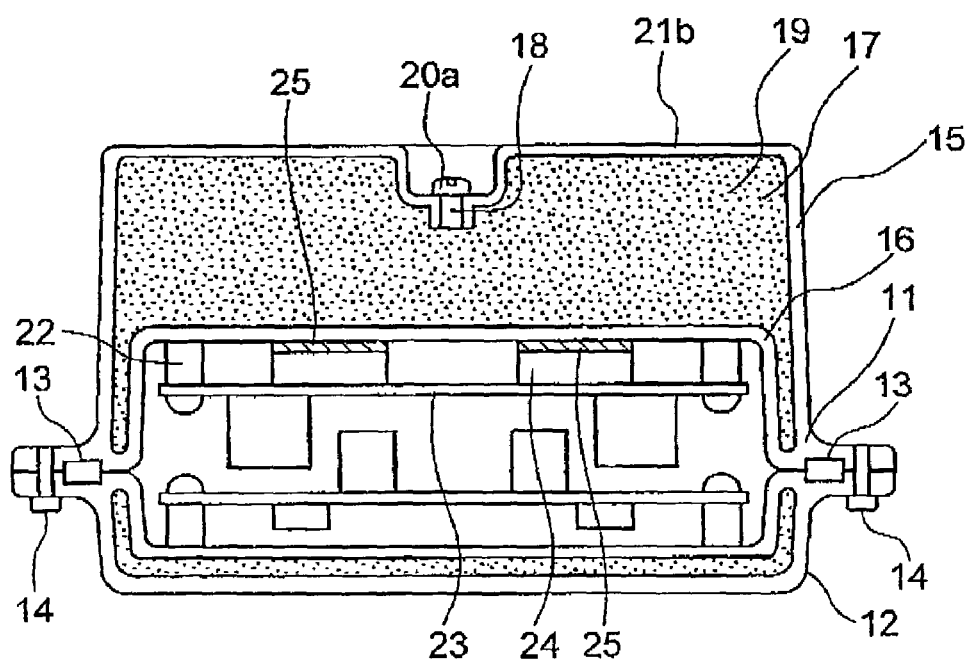
FIG. 2 is a sectional view taken along line II—II in FIG. 1.

Referring to FIG. 2, the hollow space 17 is filled with a gas refrigerant 19, which replaces high-pressure nitrogen gas after the GAIM process. More specifically, in general, high-pressure nitrogen gas is introduced into the hollow space 17 passing through an inlet port 18 during the GAIM process for the housing 10. After the GAIM process, the high-pressure nitrogen gas is discharged by using a pump etc., and in a typical GAIM process, the hollow space 17 between the inner wall 15 and the outer wall 16 is eventually filled with air after discharge of the nitrogen gas.

Figure 3:
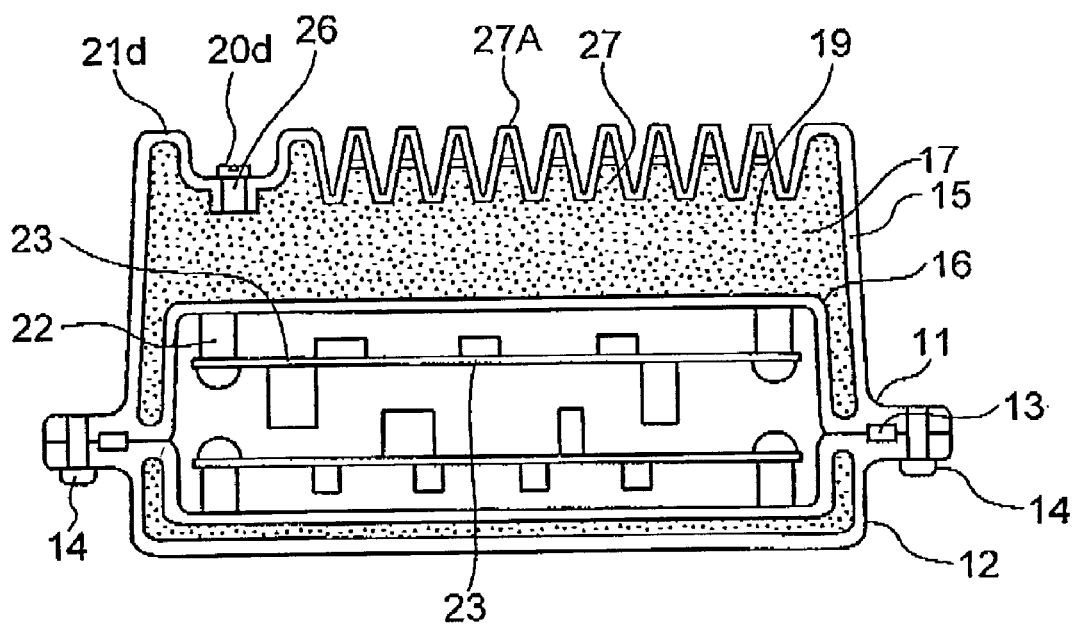
FIG. 3 is a sectional view taken along line III—III in FIG. 1.

Referring to FIG. 3, an outlet port 26 is provided on a portion of a radiation fin 21d. For filling the hollow space 17 with the gas refrigerant 19, the air in the hollow space 17 is discharged through the outlet port 26, and at the same time, a specified amount of nitrogen gas is filled into the hollow space 17 at a high pressure through the inlet port 18. Upon completion of filling the hollow space 17 with the gas refrigerant 19, plugs 21a and 21b are provided at the inlet port 18 and the outlet port 26, respectively. Hydrofluorocarbon (HFC) 134a is generally used as a material for the gas refrigerant 19. The refrigerant 19 may be a liquid refrigerant instead.

Each channel of the hollow space 17 constitutes a radiation fin 21 (21a, 21b, 21c, 21d, . . . ) at the outer surface of the outer wall 15. A sufficient number of radiation fins 21 are provided for radiation of heat generated in the integrated circuits 24.

As described before, the housing 10 receives therein a plurality of units 23 each mounting thereon a plurality of integrated circuits or internal circuits 24. The unit 23 and the housing body 11 are coupled by a plurality of bosses 22 which are provided on the inner surface of the inner wall 16. The integrated circuit 24 includes a plurality of electronic parts, which generate heat upon operation thereof. Among other electronic parts, at least one electronic part generating a large amount of heat is coupled with the inner surface of the inner wall 16 of the housing 10.

A heat conductive sheet 25 is disposed between each integrated circuit 24 and the inner surface of the inner wall 16 of the housing 10 for efficient heat conduction, with the at least one electronic part is disposed in direct contact with the heat conductive sheet 25.

In this embodiment, as described above, gas refrigerant is used as the refrigerant 19 in the hollow space 17. If the temperature of the gas refrigerant 19 is changed, a pressure control mechanism disposed for this purpose controls the pressure in the hollow space 17, as detailed below, for protecting the housing 10 against the pressure rise.

Figure 5A:
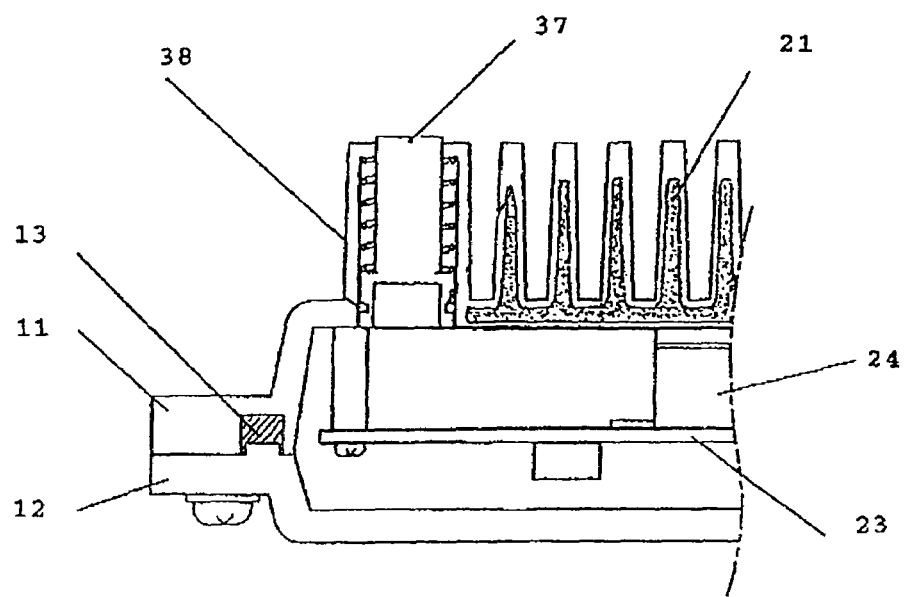
FIGS. 5a and 5b are sectional views of another embodiment of the invention.
Figure 5B:
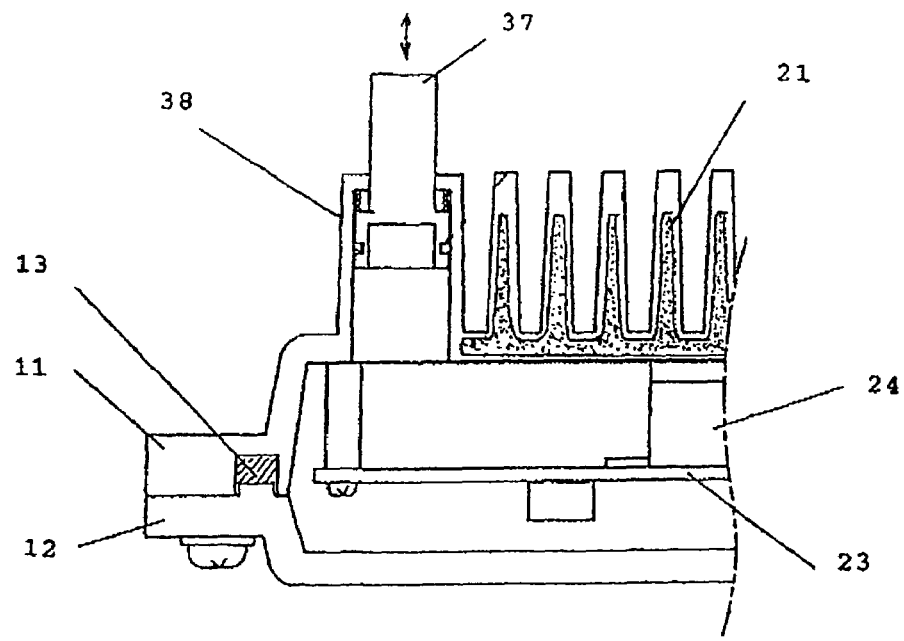

The pressure control mechanism includes a plurality of movable walls 27 disposed at the channel or internal of fin 21d, wherein the movable walls 27 move upon a specific amount of pressure rise occurring in the hollow space 17 due to a temperature rise. The movable walls 27 may be provided for each of a plurality of fins 21 in the housing 10 or may be disposed other than at the fins 21. As shown in FIGS. 5A and 5B, the pressure control mechanism may alternatively be a movable piston 37 within a cylinder 38 instead of the movable wall 27.

Figure 4:
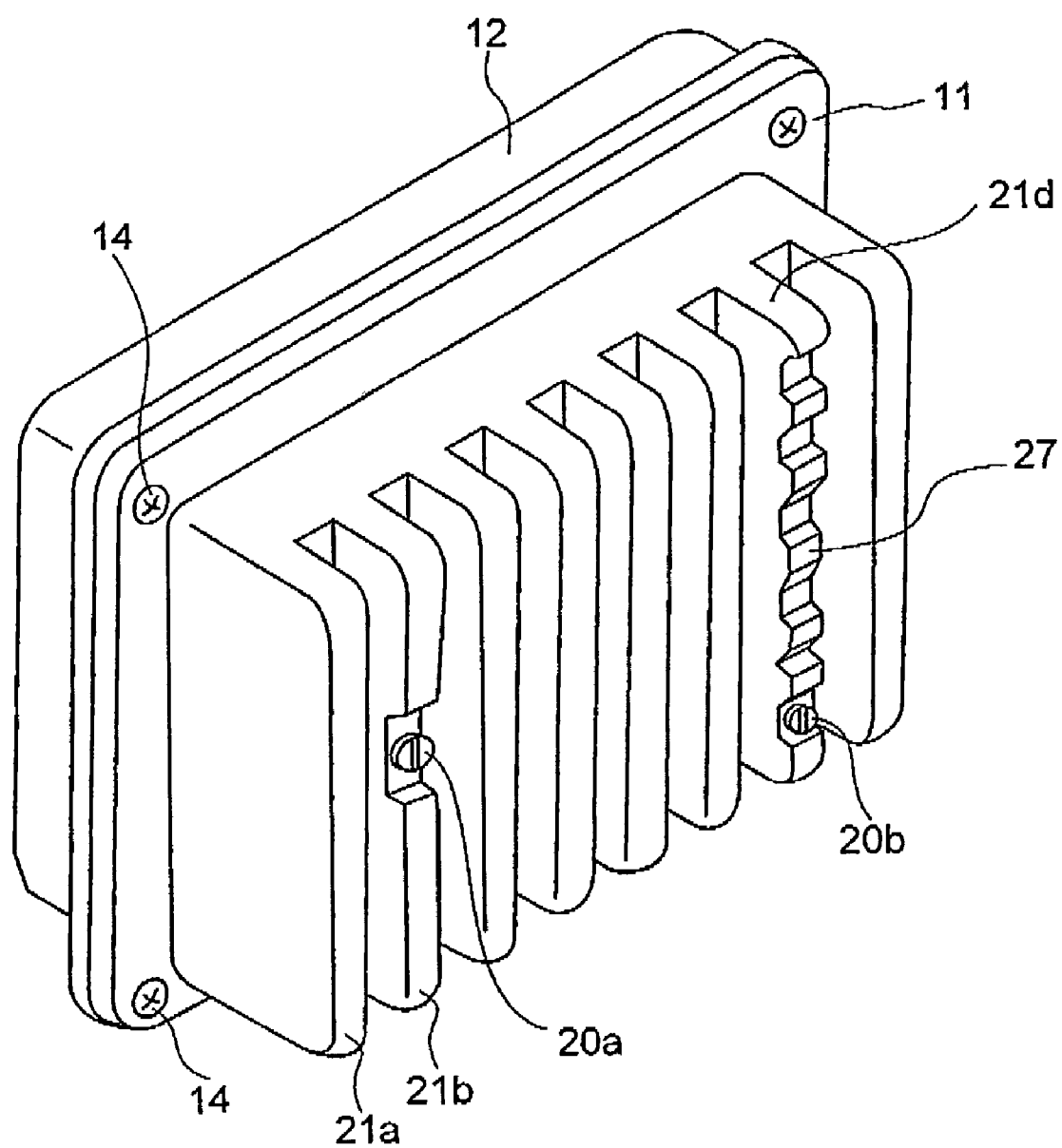
FIG. 4 is a perspective view of the telecommunication device of FIG. 1.

Referring to FIG. 4, there is shown a specific example of the embodiment as described above, which is manufactured as a typical telecommunication device, such as a base station of a personal handyphone system generally attached onto a mast or pole etc. The hollow space 17 includes a plurality of vertical channels when the telecommunication device is installed on a mast.

In operation of the telecommunication device of FIG. 1, the integrated circuits 24 generate heat based on the operating current. The heat generated in the integrated circuits 24 is transferred to the inner surface of the inner wall 16 of the housing body 11 via the heat conductive sheet 25, and then transferred to the gas refrigerant 19 in the hollow space 17.

As understood from FIG. 2, the heat exchange between the gas refrigerant 19 and the outer wall 15 is assisted by the natural convection of the refrigerant 19 in the hollow space 17, wherein a portion of the refrigerant 19 at a higher temperature residing in the vicinities of the outer wall 15 and the inner wall 16 rises upward in the hollow space 17 including the channels, whereas another portion of the refrigerant 19 at a lower temperature residing in the central region between the outer wall 15 and the inner wall 16 falls downward in the hollow space 17. Thus, the gas refrigerant 19 absorbing the heat generated by the integrated circuits 24 is circulated for heat radiation, which is effected at the outer surface of outer wall 15 of the housing 10.

In the conventional housing made of a solid metal or solid plastic material, the radiation capability is limited by the conductivity of the selected metal or plastic material, exhibiting limited radiation. On the other hand, the housing 10 in the telecommunication device of the present embodiment achieves higher heat radiation capability due to the refrigerant 19 cooling the whole area of the radiation fins 21.

When the ambient temperature of the housing 10 rises after being maintained at the room temperature, the gas refrigerant 19 in the hollow space 17 expands its volume, thereby raising the inner pressure of the hollow space 17. When the inner pressure rises up to a specified level, the movable walls 27 are shifted toward outside to the position shown by numeral 27A in FIG. 3.

On the other hand, when the ambient temperature falls from the room temperature, the refrigerant 19 in the hollow space 17 reduces its volume, whereby the movable walls 27 are shifted toward inside. If a liquid refrigerant is used, the volume change is not necessary.

Since the above embodiment is described only for an example, the present invention is not limited to the above embodiment and various modifications or alterations can be easily made therefrom by those skilled in the art without departing from the scope of the present invention.

What is claimed is:

1. A telecommunication device, comprising:
a housing comprising an inner wall, an outer wall, and a hollow space formed between said inner wall and said outer wall and receiving therein refrigerant, and
an internal circuit having a portion coupled to said inner wall via a heat conductive member,
wherein said outer wall is periodically variably shaped in cross section to define a periodically varying border between the hollow space and a medium outside of the telecommunication device, and
further comprising an inlet port and an outlet port arranged on the outer wall.

2. The telecommunication device as defined in claim 1, wherein said hollow space is completely filled with refrigerant in a gas state throughout the operational temperature range of the internal circuit.

3. The electronic device as defined in claim 1, wherein the heat conductive member is a discrete heat conductive sheet.

4. The telecommunication device as defined in claim 1, wherein said outer wall is of a constant thickness along its periodically varying shape.

5. The telecommunication device as defined in claim 1, wherein said hollow space includes a plurality of channels in a vicinity of said outer wall.

6. The telecommunication device as defined in claim 1, wherein said refrigerant is a gas refrigerant.

7. The telecommunication device as defined in claim 6, wherein said housing includes a pressure control mechanism.

8. The telecommunication device as defined in claim 7, wherein said pressure control mechanism includes a movable wall.

9. The telecommunication device as defined in claim 7, wherein said pressure control mechanism includes a movable piston.

10. The telecommunication device as defined in claim 1, further comprising a pressure control mechanism for controlling a pressure in said hollow space.

11. The telecommunication device as defined in claim 10, wherein said pressure control mechanism includes a movable wall.

12. The telecommunication device as defined in claim 10, wherein said pressure control mechanism includes a movable piston.

13. A telecommunication device, comprising:
a housing comprising an inner wall, an outer wall, and a hollow space formed between said inner wall and said outer wall and receiving therein refrigerant, and
an internal circuit having a portion coupled to said inner wall via a heat conductive member,
wherein said outer wall is periodically variably shaped in cross section to define a periodically varying border between the hollow space and a medium outside of the telecommunication device, and
wherein the periodically shaped outer wall comprises a plurality of wave shapes, and
further comprising an inlet port arranged on the distal end surface of a first wave shape, and an outlet port arranged on the distal end surface of a second wave shape different from the first.

14. A telecommunication device, comprising:
a housing comprising an inner wall, an outer wall, and a hollow space formed between said inner wall and said outer wall and receiving therein refrigerant, and
an internal circuit having a portion coupled to said inner wall via a heat conductive member,
wherein said outer wall is periodically variably shaped in cross section to define a periodically varying border between the hollow space and a medium outside of the telecommunication device,
wherein the periodically shaped outer wall comprises a plurality of wave shapes, and
wherein the wave shapes comprise protruding fins with refrigerant therein, and
further comprising an inlet port arranged on the distal end surface of a first protruding fin, and an outlet port arranged on the distal end surface of a second protruding fin different from the first.

15. A telecommunication device, comprising:
a housing comprising an inner wall, an outer wall, and a hollow space formed between said inner wall and said outer wall and receiving therein refrigerant, and
an internal circuit having a portion coupled to said inner wall via a heat conductive member,
wherein said outer wall is periodically variably shaped in cross section to define a periodically varying border between the hollow space and a medium outside of the telecommunication device, and
wherein the periodically shaped outer wall comprises repeating radiation fins separated in a longitudinal direction of the device by gaps, and the refrigerant is provided within the radiation fins, and
further comprising an inlet port arranged on the distal end surface of a first radiation fin, and an outlet port arranged on the distal end surface of a second radiation fin different from the first.

16. A telecommunication device comprising:
a housing comprising an inner wall, an outer wall, and a hollow space formed between said inner wall and said outer wall and receiving therein refrigerant, and
an internal circuit having a portion coupled to said inner wall via a heat conductive member, wherein
said outer wall is periodically variably shaped in cross section; and
the periodically shaped outer wall comprises a plurality of wave shapes,
the housing further comprising an inlet port arranged on the distal end surface of a first wave shape, and an outlet port arranged on the distal end surface of a second wave shape different from the first.

17. A telecommunication device comprising:
a housing comprising an inner wall, an outer wall, and a hollow space formed between said inner wall and said outer wall and receiving therein refrigerant, and
an internal circuit having a portion coupled to said inner wall via a heat conductive member, wherein
said outer wall is periodically variably shaped in cross section;
the periodically shaped outer wall comprises a plurality of wave shapes; and
the wave shapes comprise protruding fins with refrigerant therein,
the housing further comprising an inlet port arranged on the distal end surface of a first protruding fin, and an outlet port arranged on the distal end surface of a second protruding fin different from the first.

18. A telecommunication device comprising:
a housing comprising an inner wall, an outer wall, and a hollow space formed between said inner wall and said outer wall and receiving therein refrigerant, and
an internal circuit having a portion coupled to said inner wall via a heat conductive member, wherein said outer wall is periodically variably shaped in cross section;
the periodically shaped outer wall comprises repeating radiation fins separated in a longitudinal direction of the device by gaps, and the refrigerant is provided within the radiation fins the housing further comprising an inlet port arranged on the distal end surface of a first radiation fin, and an outlet port arranged on the distal end surface of a second radiation fin different from the first.

* * * * *